United States Patent
Tipirneni et al.

(10) Patent No.: US 9,685,545 B2
(45) Date of Patent: Jun. 20, 2017

(54) ISOLATED III-N SEMICONDUCTOR DEVICES

(71) Applicant: Texas Instruments Incorporated, Dallas, TX (US)

(72) Inventors: Naveen Tipirneni, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/951,927

(22) Filed: Nov. 25, 2015

(65) Prior Publication Data

US 2017/0148905 A1 May 25, 2017

(51) Int. Cl.
*H01L 29/778* (2006.01)
*H01L 29/20* (2006.01)
*H01L 29/06* (2006.01)

(52) U.S. Cl.
CPC ........ *H01L 29/778* (2013.01); *H01L 29/0646* (2013.01); *H01L 29/0653* (2013.01); *H01L 29/2003* (2013.01)

(58) Field of Classification Search
CPC H01L 29/778; H01L 29/0646; H01L 29/0653
See application file for complete search history.

(56) References Cited

U.S. PATENT DOCUMENTS

| 5,077,231 | A | * | 12/1991 | Plumton | H01L 21/7605 148/DIG. 72 |
| 5,276,340 | A | * | 1/1994 | Yokoyama | H01L 21/7605 257/190 |
| 2006/0261356 | A1 | * | 11/2006 | Iwakami | H01L 29/812 257/80 |
| 2007/0290298 | A1 | * | 12/2007 | Shastri | H01L 23/5227 257/532 |
| 2015/0021616 | A1 | * | 1/2015 | Lee | H01L 29/7787 257/76 |
| 2015/0028469 | A1 | * | 1/2015 | Kashyap | H01L 27/0248 257/734 |
| 2015/0034972 | A1 | * | 2/2015 | Kuraguchi | H01L 29/267 257/77 |

* cited by examiner

*Primary Examiner* — Matthew Reames
(74) *Attorney, Agent, or Firm* — Jacqueline J. Garner; Charles A. Brill; Frank D. Cimino

(57) ABSTRACT

A semiconductor device with a substrate, a low defect layer formed in a fixed position relative to the substrate, and a barrier layer comprising III-N semiconductor material formed on the low-defect layer and forming an electron gas in the low-defect layer. The device also has a source contact, a drain contact, and a gate contact for receiving a potential, the potential for adjusting a conductive path in the electron gas and between the source contact and the drain contact. Lastly, the device has a one-sided PN junction between the barrier layer and the substrate.

19 Claims, 12 Drawing Sheets

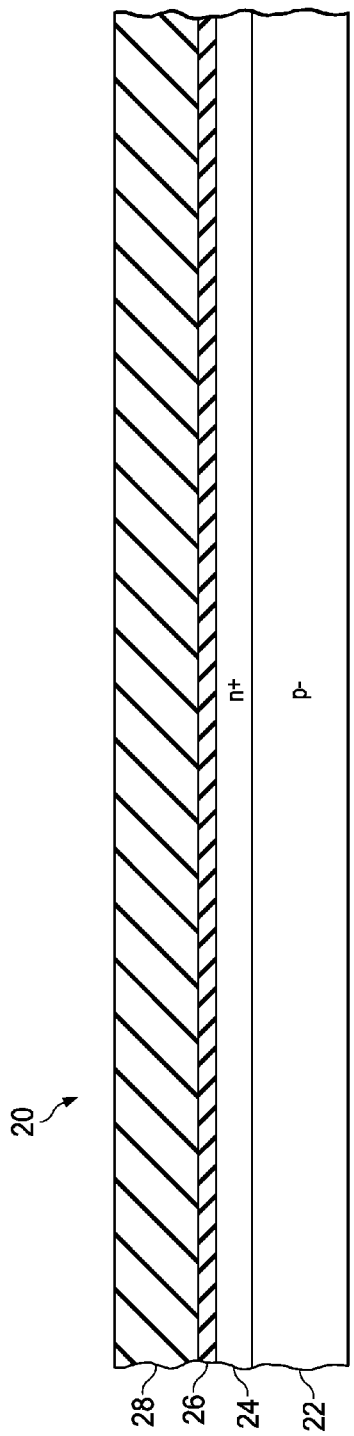
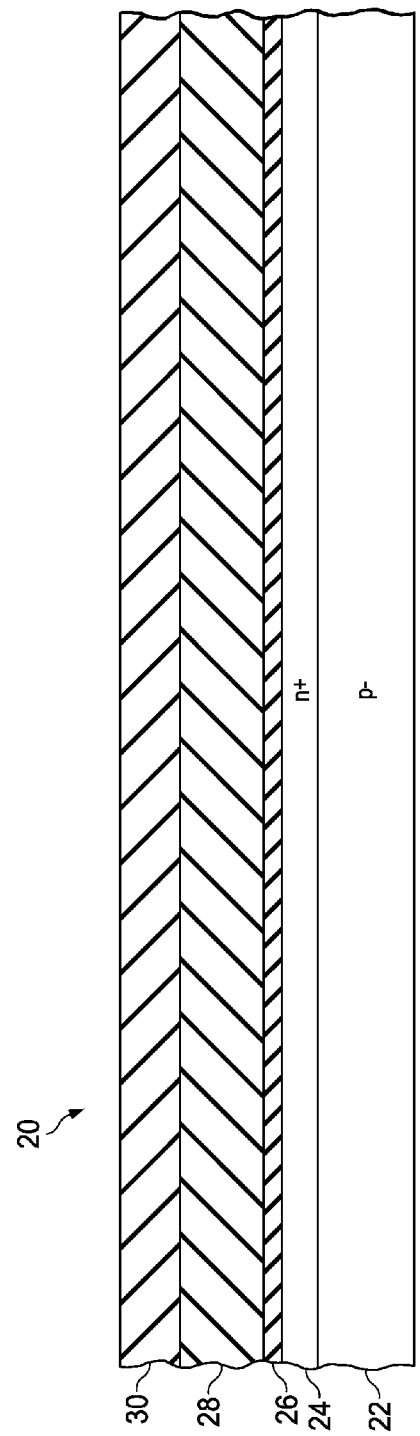

US 9,685,545 B2

ISOLATED III-N SEMICONDUCTOR DEVICES

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to semiconductor devices and, more particularly, to isolated III-N semiconductor devices.

Integrated circuit devices are typically formed in connection with various semiconductor materials. For some applications these materials include compound materials such as the known III-N semiconductors, which are known to include combinations of elements from group III of the periodic table. Such elements include aluminum, gallium, indium, and possibly boron, and as group III-N semiconductors they are combined with nitrogen, such that each element contributes to the overall semiconductor material. Examples of III-N semiconductor materials are gallium nitride, aluminum gallium nitride, indium nitride, and indium aluminum gallium nitride. Moreover, III-N semiconductor devices may be included with other silicon based devices by sharing a common silicon substrate or wafer, where accommodations are made for the III-N semiconductor devices due to the differences between the compound semiconductors and the underlying silicon substrate.

The above approach has various benefits, for example in connection with gallium nitride (GaN) devices. Such devices may include, for example, light emitting diodes (LEDs), solar cells, radiation-resistant devices, and high temperature or high voltage devices, commonly including transistors. These devices, however, may suffer from certain drawbacks, including possible instabilities when mixed with different devices based on either structure or functionality.

By way of further background, FIG. 1 illustrates a schematic of a prior art half bridge 10 that may be implemented using GaN transistors, and that as implemented may suffer drawbacks as observed by the present inventors.

Specifically, half bridge 10 includes two GaN transistors $T_1$ and $T_2$. As is well known, the drain $D(T_1)$ of transistor $T_1$ is connected to a first rail voltage (shown as $V_{line}$), and the source $S(T_2)$ of transistor $T_2$ is connected to a second rail voltage (shown as ground). As such, transistor $T_1$ is referred to as the high side, and transistor $T_2$ is referred to as the low side. The source $S(T_1)$ of transistor $T_1$ and the drain $D(T_2)$ of transistor $T_2$ are connected and provide the output, $V_{out}$, for half bridge 10. The transistor gates may be connected to various signals as shown by way of illustration with a generic input block 12; the particular signals are not of particular significance for the present discussion, other than to note that they are such that the transistors $T_1$ and $T_2$ operate in complementary fashion, that is, one is on while the other is off, and vice versa. Lastly, as is typical in various transistor configurations, each of transistors $T_1$ and $T_2$ has its source connected to the substrate of the respective transistor, where such a connection is sometimes also referred to as a backgate.

In operation, transistors $T_1$ and $T_2$ are on one at a time and typically at a 50 percent duty cycle, so $V_{out}$ tends toward $V_{line}$ when the high side transistor $T_1$ is on and toward ground when the low side transistor $T_2$ is on. Based on the load and input voltages, such circuit may have various uses, including power electronics such as in a converter, switching, and the like. While half bridge 10 has various uses and is well-known, it is recognized in connection with the preferred embodiments that issues may arise in ideally implementing the bridge using GaN technology. Specifically, the source-to-backgate connections can cause leakage, instability, or other performance-diminishing issues due to differing voltages being connected to a same substrate. For example, consider a high-voltage application, where $V_{line}$ is 400 volts. When the high side transistor $T_1$ is on, then $V_{line}$, minus the drop across transistor $T_1$, is connected to $V_{out}$. If, for example, that voltage drop is 1 volt, then when transistor $T_1$ is on, $V_{out}$=399 volts. Accordingly, the source-to-backgate connection of transistor $T_1$ couples the backgate to 399 volts, while at the same time the source-to-backgate connection of transistor $T_2$ couples the backgate to ground, thereby creating a considerable leakage path between the two transistors. As an alternative, the backgate connections instead could be implemented by connecting each transistor drain to the backgate. While the alternative reduces the leakage issue incrementally, when the high side transistor $T_1$ and low side transistor $T_2$ are off, high voltage on the backgate would result in higher surface fields for a given design and lead to lower lifetimes and thereby diminish the transistor reliability. Additional issues with this approach will include added complexity in packaging technology needs like the need of insulating die attach.

Given the preceding, the present inventors seek to improve upon the prior art, as further detailed below.

BRIEF SUMMARY OF THE INVENTION

In a preferred embodiment, there is a semiconductor device. The device comprises a substrate, a low defect layer formed in a fixed position relative to the substrate, and a barrier layer comprising III-N semiconductor material formed on the low-defect layer and forming an electron gas in the low-defect layer. The device also comprises a source contact, a drain contact, and a gate contact for receiving a potential, the potential for adjusting the electron gas and a conductive path, responsive to and formed by the electron gas between the source contact and the drain contact. Lastly, the device comprises a one-sided PN junction between the barrier layer and the substrate.

In another aspect, the preferred embodiment may include a first dielectric barrier and a second dielectric barrier. Each dielectric barrier is aligned along a respective edge of the low defect layer and the barrier layer and further extends in a direction from the low defect layer toward the substrate and to an extent below the one-sided PN junction.

Numerous other inventive aspects are also disclosed and claimed.

BRIEF DESCRIPTION OF THE SEVERAL VIEWS OF THE DRAWING

FIG. 3 illustrates a cross-sectional view of the formation of a transistor pair of FIG. 2, with the addition of a mismatch isolation layer and a buffer layer.

FIG. 4 illustrates a cross-sectional view of the formation of a transistor pair of FIG. 3, with the addition of an electrical isolation layer.

DETAILED DESCRIPTION OF EMBODIMENTS

Figure 1:
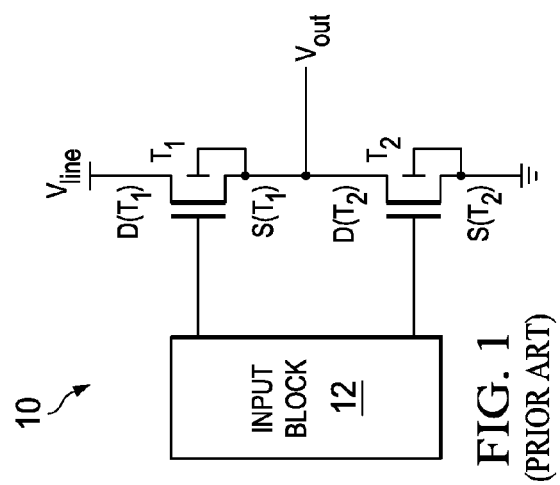
FIG. 1 illustrates a schematic of a prior art half bridge.

FIG. 1 was described earlier in the Background Of the Invention section of this document and the reader is assumed familiar with the principles of that discussion.

FIGS. 2 through 9 illustrate cross-sectional views of the formation of a transistor pair 20 according to preferred embodiments, which as understood later will include two GaN field-effect transistors (FETs). The following discussion is by way of enabling one skilled in the art to practice the preferred embodiments, while the reader should recognize that numerous semiconductor fabrication, structure, and related details are known by, or ascertainable to, one skilled in the art. Certain materials, process details, and dimensions, therefore, are omitted, as they are otherwise known and not necessary to demonstrate the inventive scope.

Figure 2:
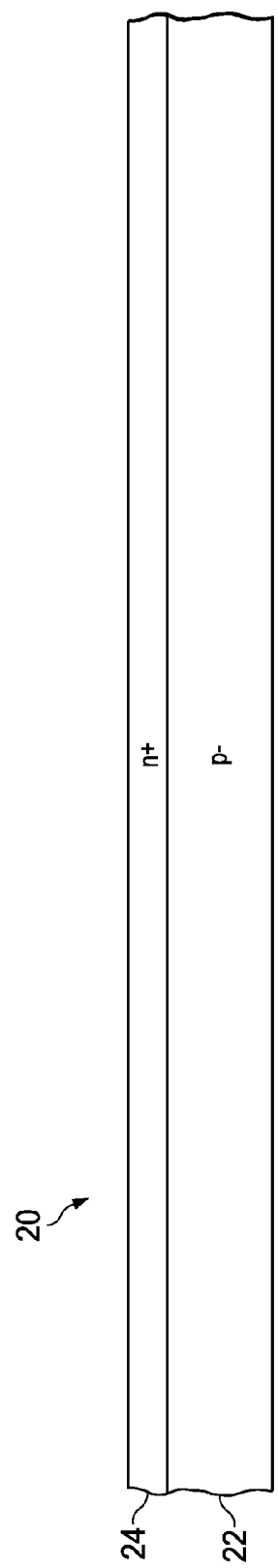
FIG. 2 illustrates a cross-sectional view of the formation of a transistor pair according to preferred embodiments, including a substrate and n+ doped layer.

Referring to FIG. 2, transistor pair 20 is formed in connection with a semiconductor substrate 22, which may be, for example, a silicon wafer, or other substrate appropriate for fabrication of GaN FETs. In the illustrated preferred embodiment, substrate 22 is a p− semiconductor material, meaning a lightly doped p-type semiconductor material. Such a doping concentration may be, for example, in the range of $1e13/cm^3$ to $3e20/cm^3$. A region or layer 24 of semiconductor material, complementary to substrate 22, is formed (e.g., grown or implanted) along an upper surface of substrate 22. In the example illustrated, because substrate 22 is p-type material, then layer 24 is n-type material. Moreover, layer 24 is preferably heavily doped, relative to substrate 22, so FIG. 2 illustrates that layer 24 is n+ in doping level. Such a doping concentration may be, for example, in the range of $1e18/cm^3$ to $1e21/cm^3$. Given the preceding, therefore, the combination of the lesser-doped substrate 22 and the greater-doped layer 24 provides what is known in the art as a one-sided PN junction, as further appreciated later in this document. Moreover, this or a comparable one-sided PN junction can be formed by growing a low doped n-type silicon ($1e13/cm^3$ to $1e18/cm^3$) layer on highly doped p+ substrate ($1e18/cm^3$ to $3e21/cm^3$) or growing a low doped ($1e13/cm^3$ to $1e18/cm^3$) p-type silicon layer on highly doped p+ substrate ($1e18/cm^3$ to $3e21/cm^3$) and subsequently forming a n+ region ($1e18/cm^3$ to $3e21/cm^3$) on top of the grown low doped silicon films.

Referring to FIG. 3, additional fabrication steps and items are represented. Specifically, a mismatch isolation layer 26 is formed on layer 24, and is so named as to establish isolation and deal with the mismatch, such as in lattice structure, between the semiconductor material of layer 24 and what will be layers that include III-N layers above layer 24. Mismatch isolation layer 26 may be, for example, 10 to 1500 nanometers of aluminum nitride. A buffer layer 28 is formed on mismatch isolation layer 26. Buffer layer 28 may be, for example, 1 to 7 microns thick and include a stack of several layers, starting with a bottom layer of the stack that is an aluminum rich compound with lesser gallium and transitioning to one or more layers toward the top of the stack, that is, with a greater amount of gallium and a lesser amount of aluminum. Thus, without limitation to a particular stoichiometry of the elements, these materials may be indicated as $Al_xGa_{1-x}N$, where x decreases toward the upper surface of buffer layer 28.

Referring to FIG. 4, an additional fabrication step and corresponding item is represented. Specifically, an electrical isolation layer 30 is formed on buffer layer 28. Electrical isolation layer 30 may be, for example, 50 to 4000 nanometers of semi-insulating gallium nitride. The semi-insulating aspect of electrical isolation layer 30 may provide a desired level of electrical isolation between layers below electrical isolation layer 30 and layers above it. Alternatively, electrical isolation layer 30 may be doped with n-type or p-type dopants to reduce undesired effects of charge trapping on current density in transistor pair 20.

Figure 5:
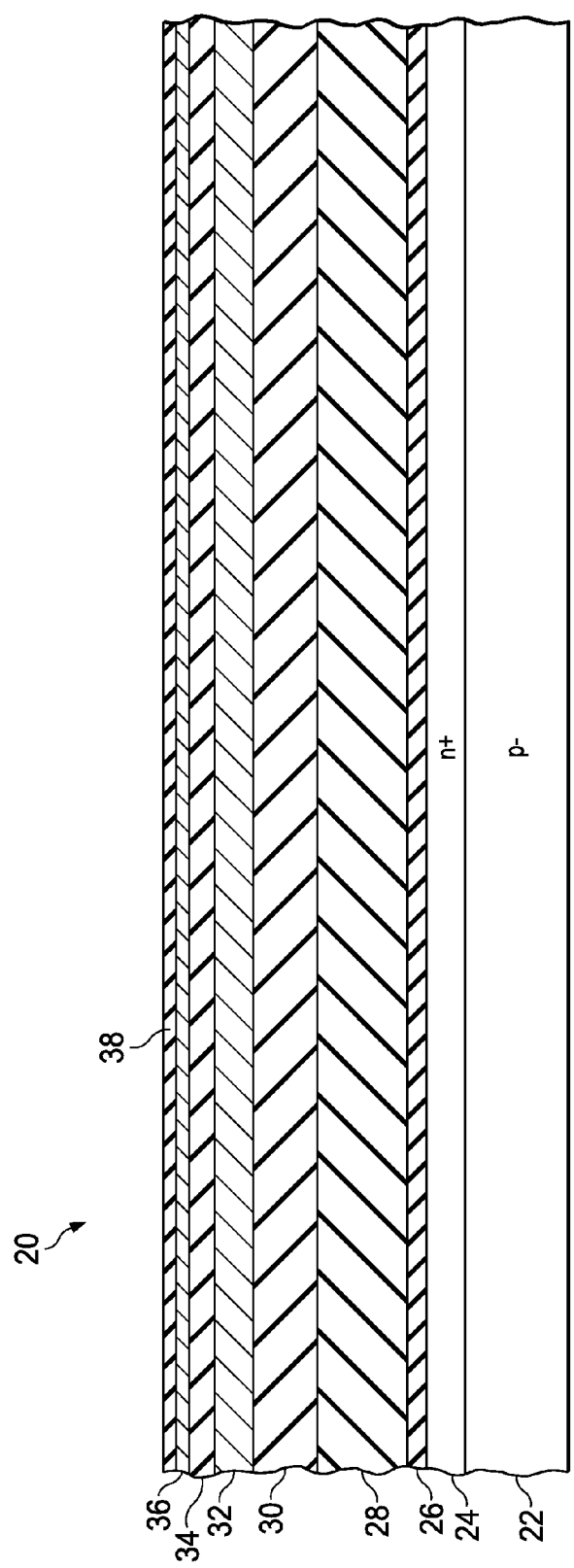
FIG. 5 illustrates a cross-sectional view of the formation of a transistor pair of FIG. 4, with the addition of a low-defect layer, a barrier layer, a cap layer, and a gate dielectric layer.

Referring to FIG. 5, additional fabrication steps and corresponding items are represented. A low-defect layer 32 is formed on electrical isolation layer 30. Low-defect layer 32 may be, for example, 25 to 2000 nanometers of gallium nitride. Low-defect layer 32 may be formed so as to minimize crystal defects that may have an adverse effect on electron mobility. The method of formation of low-defect layer 32 may result in the low-defect layer 32 being doped with carbon, iron, or other dopant species, for example with a doping density less than $1e17/cm^3$.

Continuing with FIG. 5, a barrier layer 34 is formed on low-defect layer 32. Barrier layer 34 may be, for example, 2 to 30 nanometers of $Al_xGa_{1-x}N$ or, by including indium, as $In_xAl_yGa_{1-x-y}N$. A composition of group III elements in the barrier layer 34 may be, for example, 15 to 35 percent aluminum nitride and 85 to 65 percent gallium nitride. Forming barrier layer 34 on low-defect layer 32 generates a two-dimensional electron gas in low-defect layer 32 just below barrier layer 34 with an electron density, that is, a sheet charge carrier density, for example, $1(10)^{12}$ to $2(10)^{13}/cm^2$. Note also that during formation of electrical isolation layer 30 and/or low-defect layer 32, n-type dopants are added so that a sheet charge carrier density of electrical isolation layer 30 and low-defect layer 32 provides a screen for trapped charges and image charges below the two-dimensional electron gas. The added n-type dopants may include, for example, mostly silicon and/or germanium dopants. The added n-type dopants may be added during epitaxial growth of electrical isolation layer 30 and/or low-defect layer 32. Alternatively, the added n-type dopants may be added by ion implantation after electrical isolation layer 30 and/or low-defect layer 32 is formed. An average doping density of the added n-type dopants may be, for example, 1e16/cm$^3$ to 1e17/cm$^3$. A distribution of the added n-type dopants may be substantially uniform, or may be graded so that a doping density is higher at a bottom of the doped region than at a top of the doped region.

Completing FIG. 5, an optional cap layer 36 may be formed on barrier layer 34. Cap layer 36 may be, for example, 1 to 5 nanometers of gallium nitride. Lastly, a gate dielectric layer 38 may be formed over barrier layer 34, and cap layer 36 if present, to provide a desired threshold voltage. Gate dielectric layer 38 may include, for example, silicon nitride.

Figure 6:
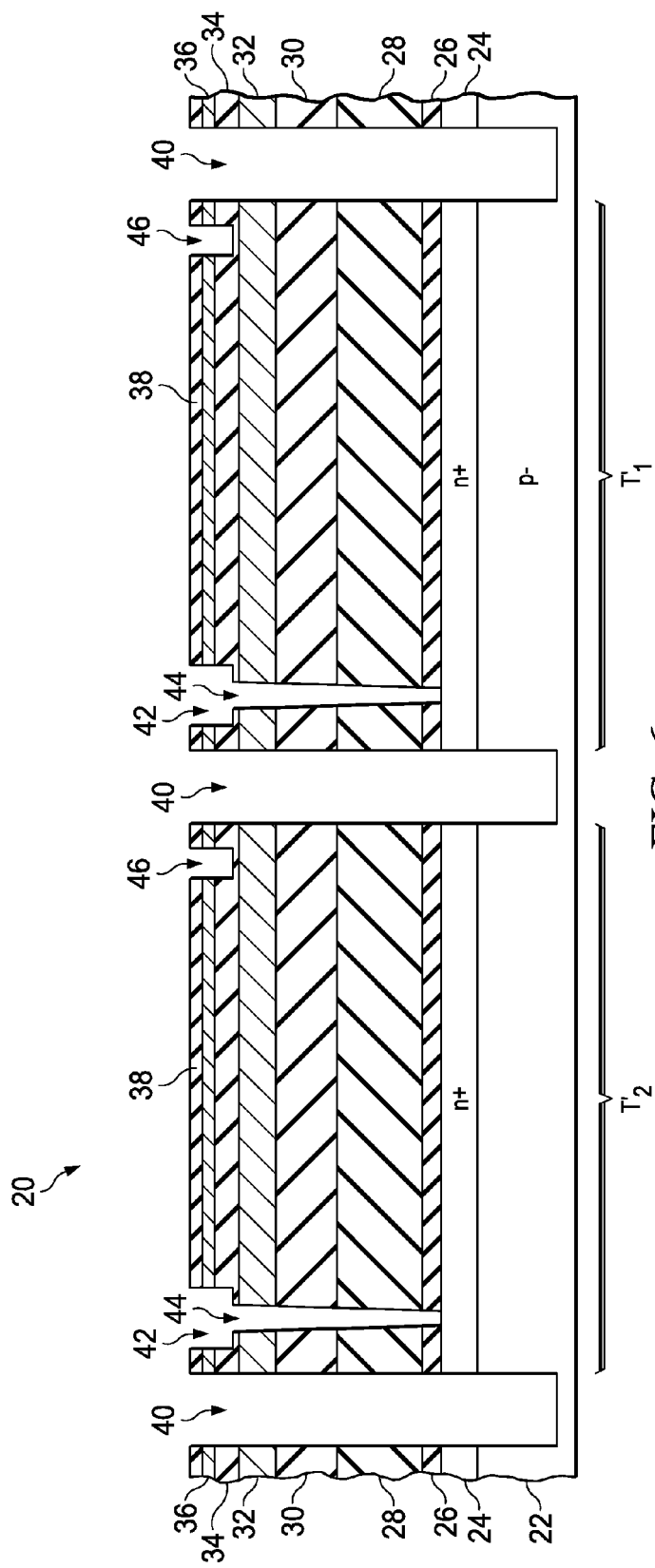
FIG. 6 illustrates a cross-sectional view of the formation of a transistor pair of FIG. 5, with the addition of trenches and vias.

Referring to FIG. 6, additional fabrication steps are represented in anticipation of forming additional structures. Specifically, in FIG. 6, isolation trenches 40 are formed by etching an aperture through all of the above-described layers and partially into substrate 22. The dimensions of trenches 40 may be selected by one skilled in the art given considerations discussed below, but by way of introduction note that trenches 40 operate to provide isolation between adjacent GaN FET transistors, as will be appreciated later. Also in FIG. 6, source etches 42 are formed by etching an aperture through the two uppermost layers, namely, cap layer 36 and gate dielectric 38, and further through a majority of the thickness of barrier layer 34, leaving an amount of barrier layer 34 so as to achieve a desirably low contact resistance. As either part of the same etch step that forms source etches 42, or as a separate etch, vias 44 are formed from etches 42 down to at least an upper surface of layer 24, which recall is the n+ portion of the one-side PN junction as formed also with the p− substrate 22; for purposes of illustration, such vias 44 are shown as conical in cross-section, but an acceptable alternative would be forming them with a vertical sidewall(s). Lastly, also as either part of the same etch step that forms source etches 42, or as a separate etch, drain etches 46 are formed by etching an aperture through the two uppermost layers, namely, cap layer 36 and gate dielectric 38, and further through a majority of the thickness of barrier layer 34, preferably to the same depth as source etches 42.

Figure 7:
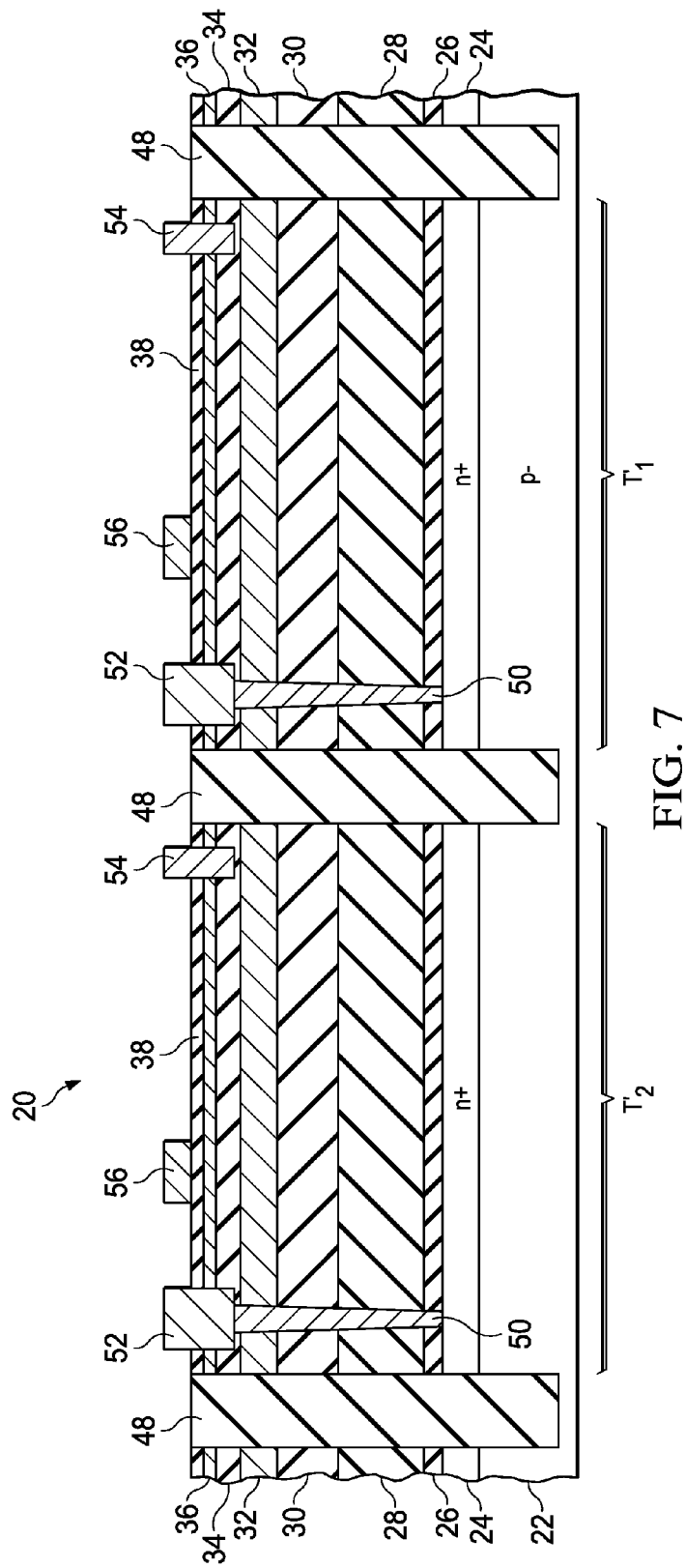
FIG. 7 illustrates a cross-sectional view of the formation of a transistor pair of FIG. 6, after the formation of dielectric barriers, source contacts, drain contacts, gate contacts, and electrical connections from source to the n+ layer of the one-sided PN junction.

Referring to FIG. 7, additional fabrication steps are represented in anticipation of forming additional structures. In FIG. 7, trenches 40 from FIG. 6 are filled with dielectric material to form dielectric barriers 48, using, for example, silicon dioxide, silicon nitride or polyamide as the dielectric material. Further, vias 44 from FIG. 6 are filled with respective conductors 50, such as metal or doped semiconductor, providing an electrical contact to layer 24. Still further, source etches 42 from FIG. 6 are filled with conductors, preferably metal, to form source contacts 52. Note that the bottom of each source contact 52 extends into, but not fully through, barrier layer 34, so as to form a tunneling connection to the two-dimensional electron gas in the low-defect layer 32. Similarly, drain etches 46 from FIG. 6 are likewise filled with conductors, preferably metal, to form drain contacts 54 that extend into, but not fully through, barrier layer 34, so as to form a tunneling connection to the two-dimensional electron gas in the low-defect layer 32. Finally, gate conductors 56 are formed between each respective set of a source contract 52 and a drain contact 54, where each such gate conductor 56 is in contact with gate dielectric layer 38. Each of gates conductors 56 may include, for example, III-N semiconductor material to provide a depletion mode FET, while other types of gates are within the scope of the instant example.

Given the added elements of FIG. 7, one skilled in the art will now appreciate that was is indicated generally as transistor pair 20 includes two GaN FETs, shown generally as T'$_1$ and T'$_2$. Moreover, for each such FET, its gate conductor 56 may be laterally separated from its respective source contact 52 by, for example, 500 to 5000 nanometers, while the lateral spacing distance between each gate 56 and a respective drain contact 54 is by a distance that depends on a maximum operating voltage of the FET. For example, in a GaN FET designed for a maximum operating voltage of 200 volts, its drain contact 54 may be laterally separated from its gate conductor 56 by 1 to 8 microns. In a GaN FET designed for a maximum operating voltage of 600 volts, its drain contact 54 may be laterally separated from its gate conductor 56 by 8 to 30 microns.

FIG. 7 also illustrates the preferred embodiment isolating effect of dielectric barriers 48. Looking by way of example to transistor T'$_1$, the dielectric barrier 48 in the middle of the page represents a first dielectric barrier along the left edge of the transistor, where that edge occurs vertically across multiple different layers, including barrier layer 34, low defect layer 32, electrical isolation layer 30, buffer layer 28, mismatch isolation layer 26, the n+ doped layer 24, and to a depth toward substrate 22 and below the one-sided PN junction formed between substrate 22 and layer 24. Similarly, the dielectric barrier 48 to the right of the page represents a second dielectric barrier along a second edge of those same layers. These barriers, therefore, serve to isolate transistor T'$_1$, and other comparably isolated devices like transistor T'$_2$, by interrupting the continuity of the layers and also extending below the one-sided PN junction. The benefits of such isolation may be appreciated by one skilled in the art and are also further discussed later.

Figure 8:
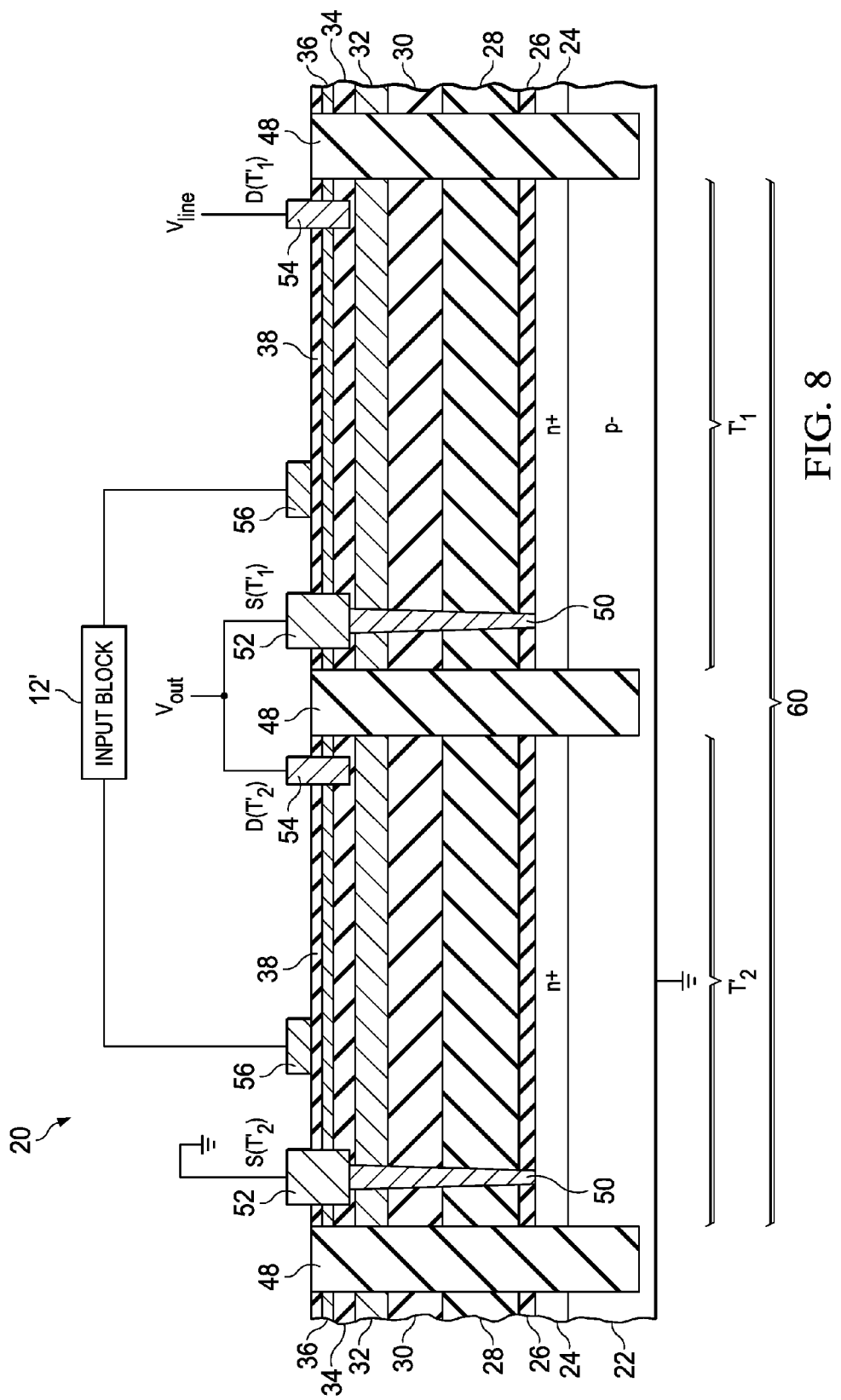
FIG. 8 illustrates a cross-sectional view of the transistor pair of FIG. 7 when electrically connected as a half bridge.
Figure 9:
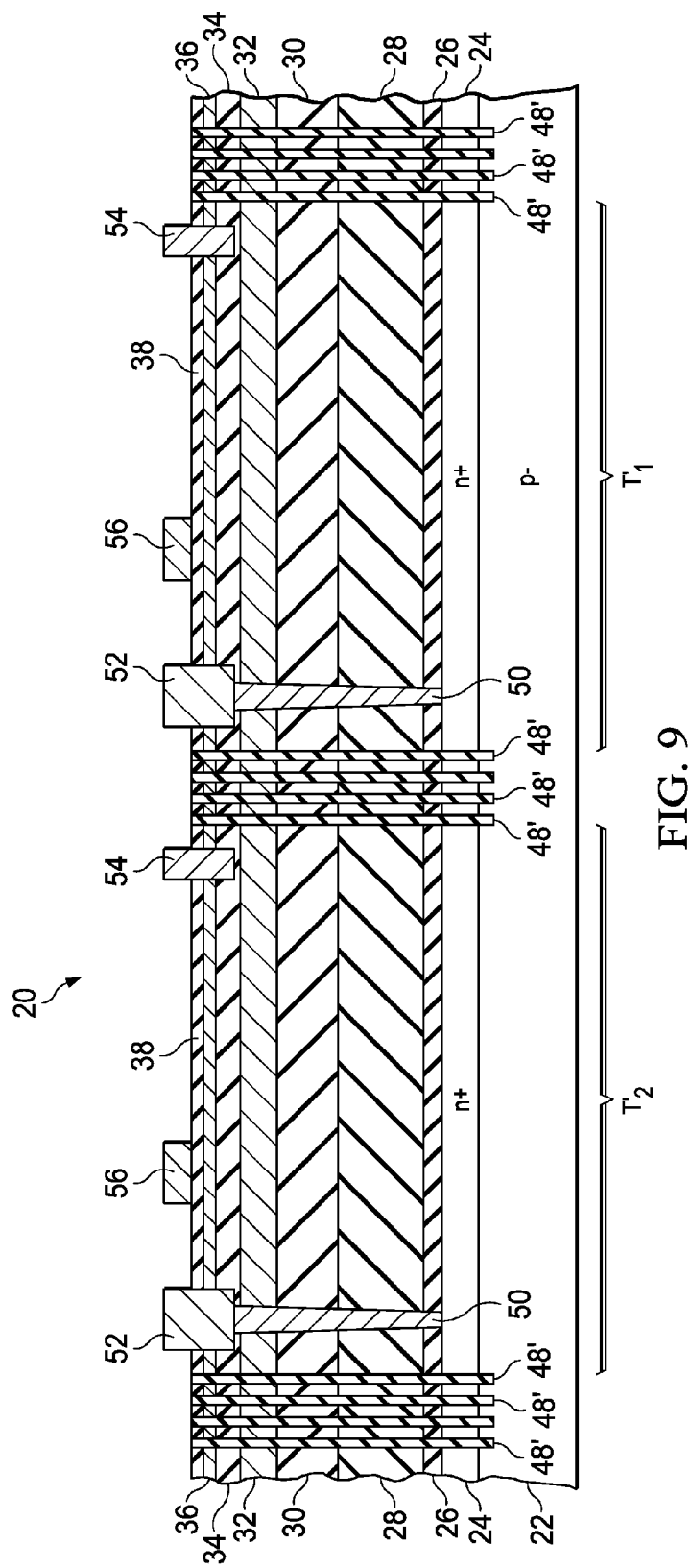
FIG. 9 illustrates a cross-sectional view of an alternative preferred embodiment for the transistor pair wherein dielectric barriers are formed using plural dielectric members.

FIG. 8 repeats the illustration of transistor pair 20 from FIG. 7, but adds a depiction of schematic connections so that a half bridge 60 is formed using transistors T'$_1$ and T'$_2$. In general, the source/drain and gate connections from half bridge 60 are comparable to those of half bridge 10 from FIG. 1, where apostrophes are added to reference identifiers in FIG. 8 to distinguish the inventive illustration from the earlier prior art; nonetheless, one skilled in the art will readily understand the half bridge configuration, in general. Beyond these connections, however, note further various aspects arising from the preferred embodiment structure of FIGS. 7 and 8. Specifically, in FIG. 8, each source contact 52 is electrically connected to layer 24, which recall is an n+ doped layer that, in combination with substrate 22, provides a one-sided PN junction; note also that substrate 22, as is often the case for various semiconductor wafers, is connected to ground. In addition, each dielectric barrier 48 provides isolation as between a transistor and any laterally-neighboring structure, where for example the dielectric barrier 48 shown in the middle of FIG. 8 separates the layers forming transistor T'$_1$ from the layers forming transistor T'$_2$; note that such separated layers include layer 24. As a result of the insulating separation, and further due to the connectivity provided by conductors 50 extending downward from each respective source contact 52, different PN biases are achieved for the one-sided PN junction in each respective transistor. More specifically, for transistor T'$_1$, its respective segment of layer 24 receives a bias of $V_{out}$ (from its source $S(T'_1)$), while the portion of semiconductor substrate 22 between the dielectric barriers 48 for that transistor is grounded. In contrast, for transistor $T'_2$, its respective segment of layer 24 receives a bias of ground (from its source $S(T'_2)$), while the portion of semiconductor substrate 22 between the dielectric barriers 48 for that transistor is also grounded. Note, therefore, that when transistor $T'_1$ is on, such as when acting as the high side in half bridge 60, the one-sided PN junction between its segment of layer 24 and substrate 22 is very strongly reversed bias, thereby isolating the transistor from leakage concerns that arise, and were described above, in connection with the prior art. In the meantime, with respect to transistor $T'_2$, it is isolated by the preferred embodiment structure and has ground connected to both sides of its isolated one-sided PN junction, thereby facilitating its proper operation.

The isolating benefits achieved by the preferred embodiment structure, including the respective isolated one-sided PN junction for each respective transistor, also will suggest to one skilled in the art the dimensions and variations for each dielectric barrier 48. In other words, such dimensions are chosen to prevent a junction breakdown in the one-sided PN junction, given the anticipated or specified voltage levels. For example, in the approach of FIG. 8, each such barrier 48 may be one to three times of $V_{isolation}/20V$ microns wide, where $V_{isolation}$ is an amount of needed isolation. Further, each such barrier 48 preferably extends to a distance in the range of one to three times of $V_{isolation}/20V$ microns below layer 24. Indeed, these considerations and dimensions demonstrate that other structures may be implemented within the preferred embodiment to achieve vertical isolation between otherwise neighboring GaN transistors. In this regard, FIG. 9 again illustrates the cross-sectional view of transistor pair 20 from FIG. 7, but each dielectric barrier 48 from FIG. 7 is replaced with a plural number of dielectric barriers 48', where each plurality in the example of FIG. 9 consists, by way of example, of four vertical dielectric barriers 48'. Once more, the dielectric material may be polyamide, silicon dioxide or silicon nitride, but note that the dimensions differ in that each dielectric barrier 48' may have a lesser width such as 1 μm to 10 μm as well as a lesser depth into substrate 22, such as a depth of 1 μm to one to three times of $V_{isolation}/20V$ microns wide, by way of comparison to the depth given for dielectric barriers 48 in FIG. 7.

FIGS. 10 through 14 illustrate cross-sectional views of the formation of an additional alternative preferred embodiment transistor pair 20, which again will include two GaN FETs. Given the various teachings above and the skill in the art, the following discussion is also by way of enabling one skilled in the art to practice the preferred embodiments, while additional details should be readily known by, or ascertainable to, one skilled in the art.

Figure 10:
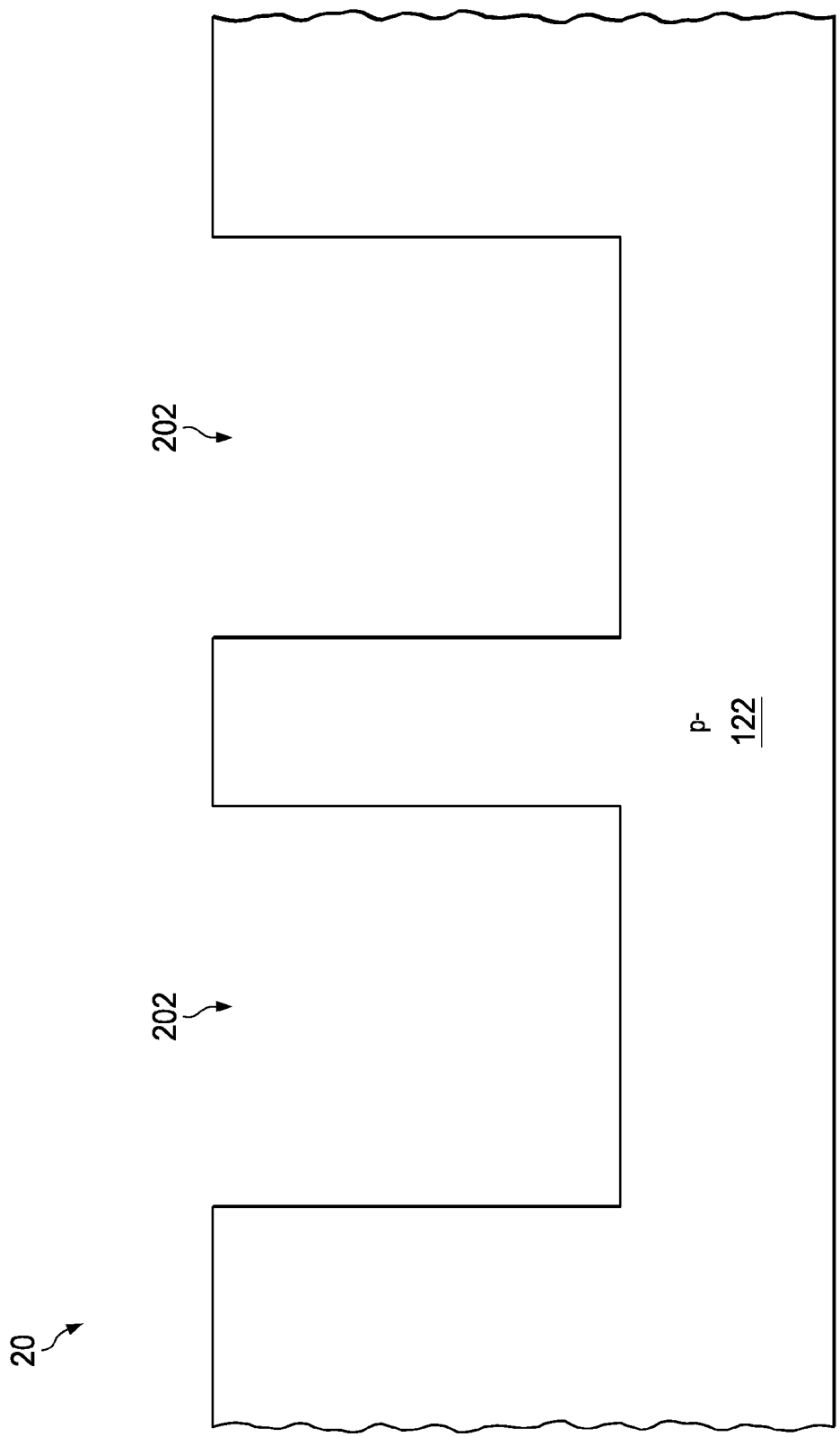
FIG. 10 illustrates a cross-sectional view of the formation of a transistor pair according to alternative preferred embodiments, including a substrate with etched regions.

Referring to FIG. 10, transistor pair 20 is formed in connection with a semiconductor substrate 122, which may be, for example, a silicon wafer, or other substrate appropriate for fabrication of GaN FETs. In the illustrated preferred embodiment, substrate 122 is a p− semiconductor material (lightly doped p-type semiconductor material). Moreover, with appropriate masking and etching (e.g., dry etch of a <111> wafer or wet etch of a <100> wafer) are performed so as to form two trenches 124 partially into substrate 122. The dimensions of trenches 124 may be selected by one skilled in the art given considerations discussed below, but by way of introduction note that trenches 124 operate to provide the active area, and some isolation, between a GaN FET transistor formed in each trench, as will be appreciated later. Note also that the sidewalls of trenches 124 may be vertical or sloped, depending on etch conditions.

Figure 11:
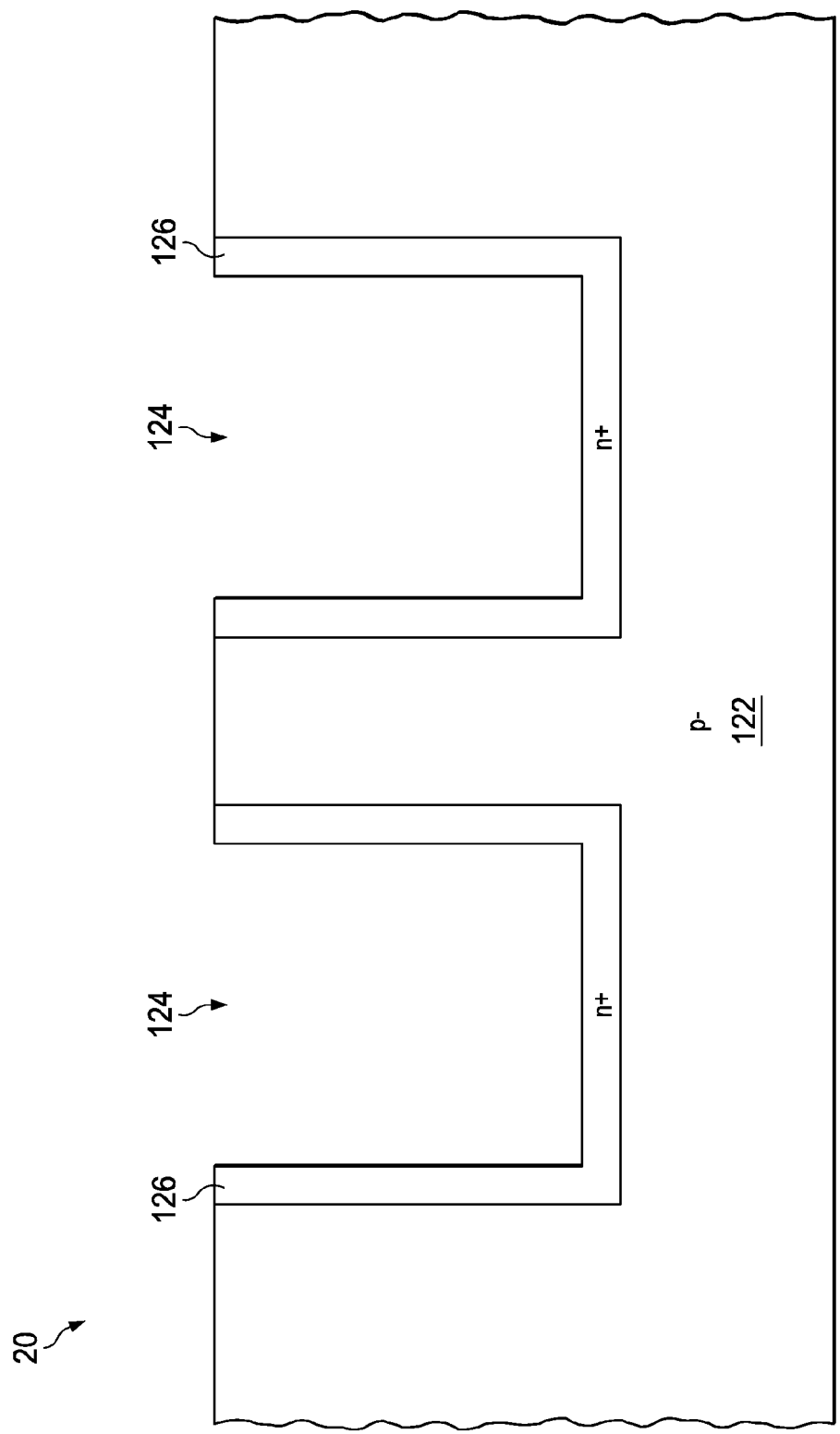
FIG. 11 illustrates a cross-sectional view of the formation of a transistor pair of FIG. 10, with the addition of n+ regions formed along the etched region surfaces.

FIG. 11 illustrates additional fabrication steps and items. Specifically, a region or layer 126 of semiconductor material, complementary to substrate 122, is formed (e.g., grown or implanted) along an upper surface of each trench 124 (i.e., parallel to the plane of substrate 122), and also along each sidewall of each trench 124. For example, a quad implant may be used to alternate positioning of substrate 122 so as to implant layer 126 along these exposed trench surfaces in substrate 122, whereby layer 126 thereby extends both along the bottom of the trench and upward toward the upper surface of substrate 122. In the example illustrated, because substrate 122 is p-type material, then layer 126 is n-type material. Moreover, layer 126 is preferably heavily doped, relative to substrate 122, so FIG. 11 illustrates that layer 126 is n+ in doping level (e.g., 1e18/cm$^3$ to 1e21/cm$^3$). Again, therefore, the combination of the lesser-doped substrate 122 and the greater-doped layer 126 provides a one-sided PN junction, as further appreciated from the teachings in this document. As with earlier embodiments, this or a comparable one-sided PN junction can be formed by growing a low doped n-type silicon (1e13/cm$^3$ to 1e18/cm$^3$) layer on highly doped p+ substrate (1e18/cm$^3$ to 3e21/cm$^3$) or growing a low doped (1e13/cm$^3$ to 1e18/cm$^3$) p-type silicon layer on highly doped p+ substrate (1e18/cm$^3$ to 3e21/cm$^3$) and subsequently forming a n+ region (1e18/cm$^3$ to 3e21/cm$^3$) on top of the grown low doped silicon films.

Figure 12:
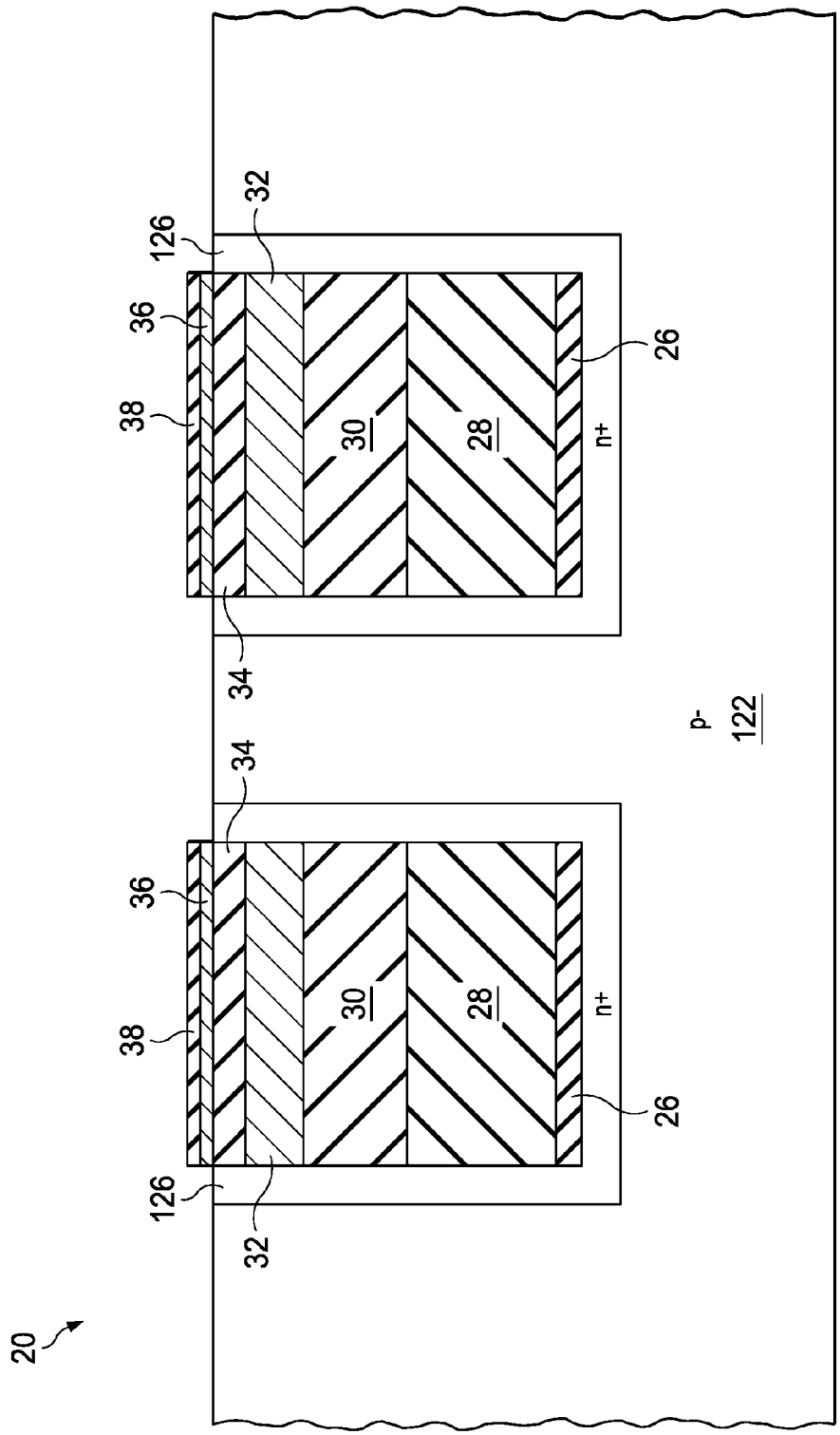
FIG. 12 illustrates a cross-sectional view of the formation of a transistor pair of FIG. 11, with the addition of various GaN transistor layers formed within the area inside the n+ regions.

Referring to FIG. 12, additional fabrication steps and items are represented. Specifically, in FIG. 12, the remaining open region from trenches 124 (see FIG. 10) are filled with additional layers toward ultimately forming a respective GaN FET in each trench, along the already-formed layer 126, where reference number are repeated in FIG. 12 from the earlier embodiment in FIG. 5, where such layers were detailed. Thus, in FIG. 12, such layers include a mismatch isolation layer 26, a buffer layer 28, an electrical isolation layer 30, a low-defect layer 32, a barrier layer 34, an optional cap layer 36, and a gate dielectric layer 38.

Figure 13:
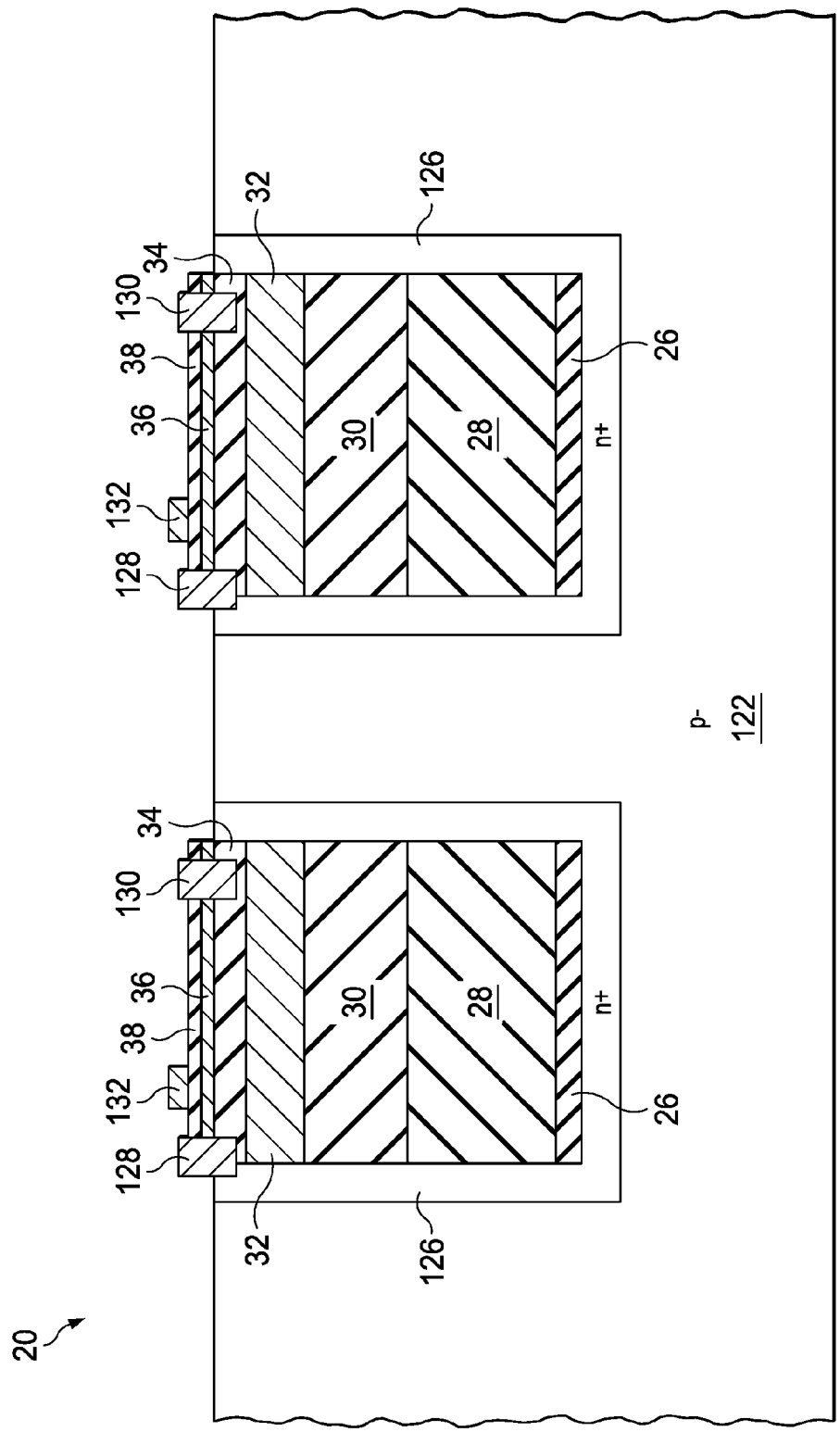
FIG. 13 illustrates a cross-sectional view of the formation of a transistor pair of FIG. 12, with the addition of source, drain, and gate contacts.

Referring to FIG. 13, additional fabrication steps are represented. Specifically, trenches (not shown) are formed from the upper surface illustrated in FIG. 12 and filled with conductors, preferably metal, to form source contacts 128. Note that the bottom of each source contact 128 extends into, but not fully through, barrier layer 34, so as to form a tunneling connection to the two-dimensional electron gas in the low-defect layer 32; in addition, however, note that each source contact 128 also contacts, or optionally through an intermediate conductor (not shown), electrically communicates with layer 126 and preferably to the portion of that layer that extended upward toward the surface of substrate 122. From an electrical standpoint, however, this connectivity is like the combination of a source contact 52 and a conductor 50 as shown in the embodiment of FIG. 7, in that the embodiment of FIG. 13 also connects the source potential to the one-sided PN junction at the bottom of the GaN transistor. Also in connection with FIG. 13, note that in the same (or comparable) process that forms source contacts 128, drain etches (not shown) are likewise filled with conductors, preferably metal, to form drain contacts 130 that extend into, but not fully through, barrier layer 34, so as to form a tunneling connection to the two-dimensional electron gas in the low-defect layer 32. Finally, gate conductors 132 are formed between each respective set of a source contact 128 and a drain contact 130, where each such gate conductor 132 is in contact with gate dielectric layer 38.

Figure 14:
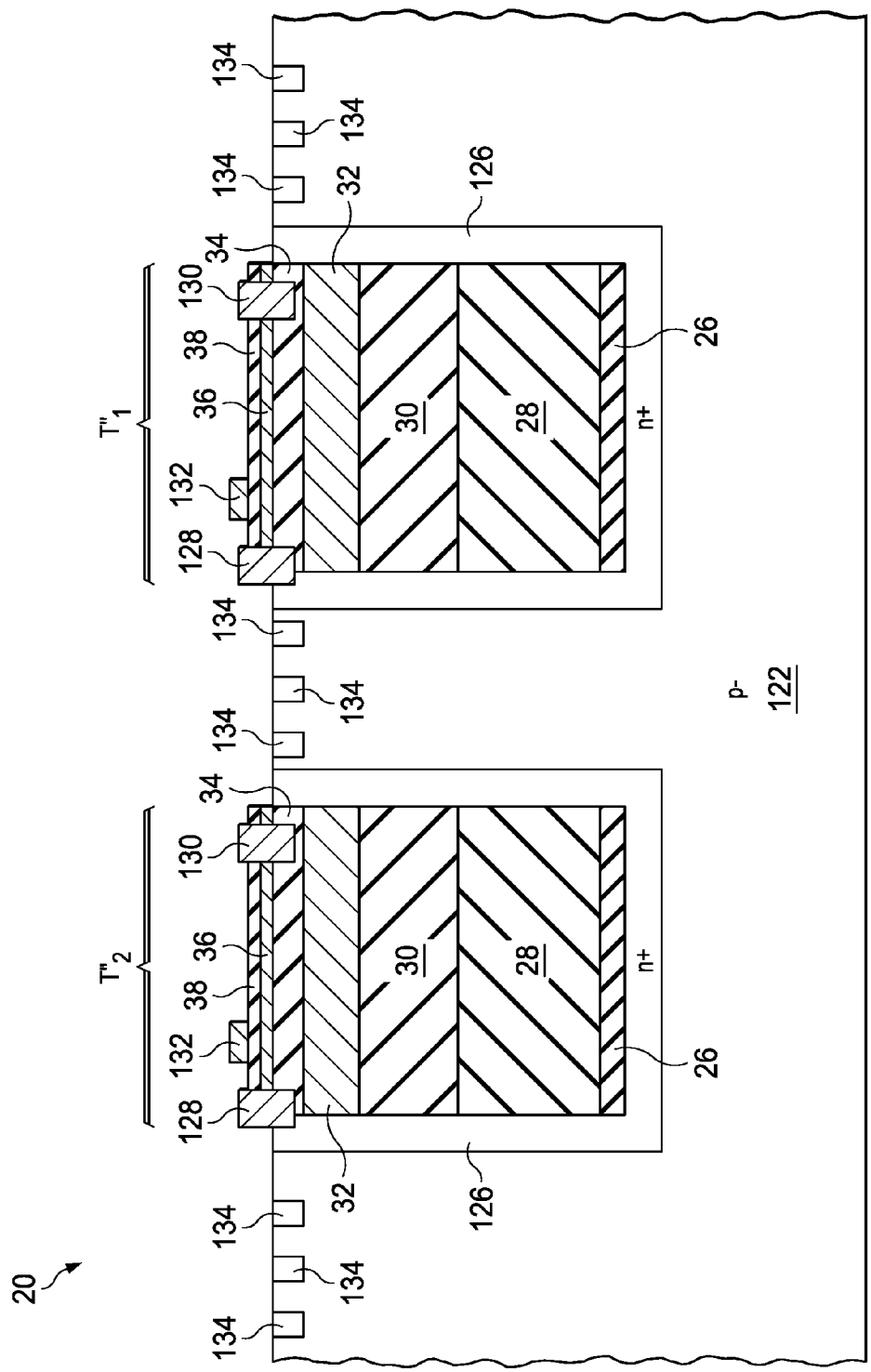
FIG. 14 illustrates a cross-sectional view of the formation of a transistor pair of FIG. 13, with the addition of electrically floating regions for spreading the surface electric field.

FIG. 14 illustrates a final preferred embodiment structure added to that shown in FIG. 13. Specifically, in FIG. 13, additional electrically floating n+ regions 134 are formed through the upper surface of substrate 122 with appropriate masking (not shown), where in the example illustrated three such regions are formed between, and outside outer edges, of what one skilled in the art will now appreciate that is indicated generally as transistor pair 20 including two GaN FETs, shown generally as T"$_1$ and T"$_2$. Electrically floating n+ regions 134 operate to spread the electric field as depletion occurs and starts to expand at the surface, so that each region may acquire some voltage between the potential applied across each transistor (e.g., 0 to 600 volts). In this manner, the surface filed is reduced, such a below a certain level that is desired for device reliability.

From the above, various embodiments provide improvements to III-N semiconductor transistors, such as GaN FETs. Various aspects have been described, and still others will be ascertainable by one skilled in the art from the present teachings. For example, while various dimensions have been provided, one skilled in the art may adjust such measures according to application and other considerations. As another example, while a preferred embodiment half bridge has been described, the preferred embodiment structure may be used with individual FETs, FETs in other configurations, and an FET combined with devices other than FETs formed relative to a same substrate, yet isolating such FET from such devices using the preferred embodiment teachings. Indeed, various transistor components described herein also may be found in U.S. Pat. No. 8,759,879, issued Jun. 24, 2014, which is hereby incorporated herein by reference; this referenced patent includes other transistor configurations that also may be readily combined by one skilled in the art with the teachings of this document. As still another example, while a preferred embodiment one-side PN junction has been described with respect to the substrate as part of the junction, in another preferred embodiment that junction may be achieved using GaN layers apart from the substrate. For example, a p-type/SI—GaN or AlGaN layer is grown on top of p+ silicon or suitable substrate with then an n+ layer formed on the surface of that p-type or SI—GaN by epitaxy or implant. Following this, all other layers may be similar to those described above, where the vias will be formed to contact the n+ III-nitride layer in this alternative. Still further, while various alternatives have been provided according to the disclosed embodiments, still others are contemplated and yet others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A semiconductor device, comprising:
   a substrate;
   a gallium-nitride layer formed in a fixed position relative to the substrate;
   a barrier layer comprising III-N semiconductor material formed on the gallium-nitride layer and forming an electron gas in the gallium-nitride layer;
   a source contact;
   a drain contact;
   a gate contact between the source contact and the drain contact;
   a one-sided PN junction comprising a first n-type region located between the barrier layer and the substrate;
   a first dielectric filled trench along a first edge of the gallium-nitride layer and a first edge of the barrier layer, the first dielectric filled trench further extending in a direction from the gallium-nitride layer toward the substrate and to an extent below the first n-type region of the one-sided PN junction; and
   a second dielectric filled trench along a second edge of the gallium-nitride layer and a second edge of the barrier layer, the second dielectric filled trench further extending in a direction from the gallium-nitride layer toward the substrate and to an extent below the first n-type region of the one-sided PN junction.

2. The semiconductor device of claim 1 wherein a single transistor is formed between the first dielectric filled trench and the second dielectric filled trench, the single transistor comprising the source contact, the drain contact, the gate contact, and the electron gas.

3. The semiconductor device of claim 2 and further comprising a second transistor formed relative to the substrate and adjacent the first transistor, the second transistor isolated from the first transistor by the first dielectric filled trench.

4. The semiconductor device of claim 3 wherein the second transistor comprises a second one-sided PN junction, isolated from the one-sided PN junction of the first transistor by the first dielectric filled trench.

5. The semiconductor device of claim 4:
   wherein the second one-sided PN junction comprises a second n-type region;
   wherein the second transistor further comprises:
      a second source contact; and
      a conductive member between the second source contact and the second n-type region.

6. The semiconductor device of claim 5 and further comprising electrical connectivity between the first transistor and the second transistor for forming a half bridge circuit.

7. The semiconductor device of claim 1, further comprising a conductive member between the source contact and the first n-type region.

8. The semiconductor device of claim 7 wherein the one-sided PN junction further comprises a p-type region having a doping concentration lower than the first n-type region.

9. The semiconductor device of claim 1:
   wherein the device has an isolation voltage; and
   wherein each of the first dielectric filled trench and the second dielectric filled trench has a width in a range of one to three times the isolation voltage divided by 20V microns wide.

10. The semiconductor device of claim 1:
    wherein the device has an isolation voltage; and
    wherein each of the first dielectric filled trench and the second dielectric filled trench has a depth below the one-sided PN junction in a range of one to three times the isolation voltage divided by 20V microns wide.

11. The semiconductor device of claim 1 and further comprising a mismatch isolation layer adjacent the first n-type region.

12. The semiconductor device of claim 11:
    and further comprising a buffer layer adjacent the mismatch isolation layer, the buffer layer comprising a first layer adjacent the mismatch isolation layer and a second layer, away from the mismatch isolation layer and adjacent the first layer;

wherein the first layer and second layer comprise aluminum and gallium; and wherein the first layer comprises more aluminum and less gallium than the second layer.

13. The semiconductor device of claim 12 and further comprising an electrical isolation layer adjacent the buffer layer.

14. The semiconductor device of claim 13 wherein the electrical isolation layer comprises semi-insulating gallium nitride.

15. The semiconductor device of claim 14 wherein the barrier layer is adjacent the electrical isolation layer.

16. The semiconductor device of claim 1 wherein the one-sided PN junction comprises a first layer comprising p-type gallium nitride and the first n-type region, adjacent the first layer, comprising n-type gallium nitride.

17. The semiconductor device of claim 1 wherein the first n-type region comprises a first portion substantially parallel to a plane along a length of the substrate and a second portion extending from the first portion to the barrier layer.

18. The semiconductor device of claim 17 wherein the source contact contacts the second portion.

19. A method of forming a semiconductor device relative to a substrate, comprising:

forming a gallium-nitride layer formed in a fixed position relative to the substrate;

forming a barrier layer comprising III-N semiconductor material formed on the low-defect layer and forming an electron gas in the gallium-nitride layer;

forming a source contact;

forming a drain contact;

forming a gate contact for receiving a potential, the potential for adjusting the electron gas and a conductive path, responsive to and formed by the electron gas, between the source contact and the drain contact; and forming a one-sided PN junction comprising an n-type layer located between the barrier layer and the substrate;

forming a first dielectric filled trench along a first edge of the gallium-nitride layer and a first edge of the barrier layer, the first dielectric filled trench further extending in a direction from the gallium-nitride layer toward the substrate and to an extent below the n-type layer of the one-sided PN junction; and forming a second dielectric filled trench along a second edge of the gallium-nitride layer and a second edge of the barrier layer, the second dielectric filled trench further extending in a direction from the gallium-nitride layer toward the substrate and to an extent below the n-type layer of the one-sided PN junction.

* * * * *